(12) United States Patent  
Ding

(10) Patent No.: US 10,008,478 B2
(45) Date of Patent: Jun. 26, 2018

(54) FABRICATING METHOD FOR WAFER-LEVEL PACKAGING

(71) Applicant: TONGFU MICROELECTRONICS CO., LTD., Nantong (CN)

(72) Inventor: Wanchun Ding, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 0 days. days.

(21) Appl. No.: 15/326,401

(22) PCT Filed: Nov. 24, 2015

(86) PCT No.: PCT/CN2015/095422
§ 371 (c)(1),
(2) Date: Jan. 13, 2017

(87) PCT Pub. No.: WO2016/107336
PCT Pub. Date: Jul. 7, 2016

(65) Prior Publication Data
US 2017/0213810 A1  Jul. 27, 2017

(30) Foreign Application Priority Data

Dec. 30, 2014  (CN) .......................... 2014 1 0839944
Dec. 30, 2014  (CN) .......................... 2014 1 0842488
Dec. 30, 2014  (CN) .......................... 2014 1 0844697

(51) Int. Cl.
*H01L 21/56* (2006.01)
*H01L 23/00* (2006.01)
(Continued)

(52) U.S. Cl.
CPC ........ *H01L 25/0657* (2013.01); *H01L 21/563* (2013.01); *H01L 24/03* (2013.01);
(Continued)

(58) Field of Classification Search
CPC ..... H01L 25/0657; H01L 24/11; H01L 24/03; H01L 24/17; H01L 24/09; H01L 24/81;
(Continued)

(56) References Cited

FOREIGN PATENT DOCUMENTS

CN   103633051 A   3/2014
CN   104241233 A   12/2014
(Continued)

OTHER PUBLICATIONS

CN104599980 Machine Translation.*
(Continued)

*Primary Examiner* — Caleen Sullivan
(74) *Attorney, Agent, or Firm* — Anova Law Group, PLLC

(57) ABSTRACT

The present disclosure discloses a fabrication method for wafer-level packaging, comprising: forming a first photoresist on a first chip and a plurality of first openings at the first photoresist to expose a functional surface of the first chip, forming an under-bump metal layer on the functional surface exposed through the plurality of first openings, and removing the first photoresist; connecting a functional solder bump of a second chip to the under-bump metal layer on the first chip; forming a filling layer between the first chip, and the second chip; and forming a connecting member on the first chip, wherein a solder ball is disposed at a top surface of the connecting member, and an apex of the solder ball is higher than a top surface of the second chip.

20 Claims, 9 Drawing Sheets

(51) Int. Cl.
*H01L 25/00* (2006.01)
*H01L 25/065* (2006.01)

(52) U.S. Cl.
CPC .............. *H01L 24/09* (2013.01); *H01L 24/11* (2013.01); *H01L 24/17* (2013.01); *H01L 24/81* (2013.01); *H01L 25/50* (2013.01); *H01L 2224/03622* (2013.01); *H01L 2224/0401* (2013.01); *H01L 2224/1162* (2013.01); *H01L 2224/11334* (2013.01); *H01L 2224/13083* (2013.01); *H01L 2224/13111* (2013.01); *H01L 2224/13147* (2013.01); *H01L 2224/13155* (2013.01); *H01L 2224/16145* (2013.01); *H01L 2224/81815* (2013.01); *H01L 2225/06513* (2013.01); *H01L 2225/06568* (2013.01); *H01L 2924/2064* (2013.01); *H01L 2924/20641* (2013.01); *H01L 2924/20642* (2013.01)

(58) Field of Classification Search
CPC .................... H01L 21/563; H01L 25/50; H01L 2224/16145; H01L 2224/11334; H01L 2224/81815; H01L 2225/06568; H01L 2225/06513; H01L 2224/13111; H01L 2224/0401; H01L 2224/13155; H01L 2224/13083; H01L 2924/20641; H01L 2924/2064; H01L 2224/13147; H01L 2224/1162; H01L 2224/03622; H01L 2924/20642

USPC ........................................................ 438/107
See application file for complete search history.

(56) References Cited

FOREIGN PATENT DOCUMENTS

| CN | 104599980 A | 5/2015 |
| CN | 104616998 A | 5/2015 |
| CN | 104681452 A | 6/2015 |

OTHER PUBLICATIONS

The World Intellectual Property Organization (WIPO) International Search Report for PCT/CN2015/095422 dated Feb. 3, 2016 P. 1-6

* cited by examiner

FABRICATING METHOD FOR WAFER-LEVEL PACKAGING

CROSS-REFERENCES TO RELATED APPLICATIONS

This application is a national stage-patent application of PCT application No. PCT/CN2015/095422, filed on Nov. 24, 2015, which claims priority to Chinese Patent Application No. 2014108424882, filed on Dec. 30, 2014, Chinese Patent Application No. 201410839944.8, filed on Dec. 30, 2014, and Chinese Patent Application No. 201410844697, filed on Dec. 30, 2014, the entire content of all of which is incorporated herein by reference.

FIELD OF THE DISCLOSURE

The present disclosure relates to semiconductor fabrication methods, and more specifically, relates to a fabrication method for wafer-level packaging.

BACKGROUND

Since chips have more and more functions, the requirements for chip packaging become higher and higher. Flip packaging and stack packaging of chips have become a trend and, meanwhile, the packaging thickness is desired to be as thin as possible, which to a certain degree requires the chip packaging to be as thin as possible. However, processing risks may be increased accordingly.

BRIEF SUMMARY OF THE DISCLOSURE

In the following, an overview of the present disclosure is given simply to provide basic understanding to some aspects of the present disclosure. It should be understood that this overview is not an exhaustive overview of the present disclosure. It is not intended to determine a critical part or an important part of the present disclosure, nor to limit the scope of the present disclosure. An objective of the overview is only to give some concepts in a simplified manner, which serves as a preface of a more detailed description described later.

The present disclosure discloses a fabrication method for wafer-level packaging, comprising: forming a first photoresist on a first chip, and forming a plurality of first openings at the first photoresist to expose a functional surface of the first chip, forming an under-bump metal layer on the functional surface exposed through the plurality of first openings, and removing the first photoresist; connecting a functional solder bump of a second chip to the under-bump metal layer on the first chip; forming a filling layer between the first chip and the second chip; and forming a connecting member on the first chip, wherein a solder ball is disposed at a top surface of the connecting member, and an apex of the solder ball is higher than a top surface of the second chip.

Compared to existing technologies, the disclosed fabrication method for wafer-level packaging has at least the following advantages. The under-bump metal layer is formed on the first chip, the first chip and the second chip are disposed face-to-face, between which the filling layer is formed, such that the thickness of the stack packing is reduced. Moreover, the solder ball is mounted on the connecting base (e.g., power connecting post, connecting layer or the portion of the under-bump metal layer other than the portion of the under-bump metal layer connected to the second chip) to form the connecting member, through which a certain height difference is formed between the connecting member disposed on the first chip and the second chip. Thus, a flip packaging of the chip is realized while the chip structure is not destroyed. That is, the second chip will not be destroyed during the flip packaging, thereby reducing the processing risks.

BRIEF DESCRIPTION OF THE DRAWINGS

To more clearly illustrate the embodiments of the present disclosure or the technical solutions of the prior art, the drawings to be used in the description of the embodiments or the prior art will be briefly described below. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

DETAILED DESCRIPTION

To make the objective, technical solutions and advantages of the present disclosure more clear, the technical solutions of the embodiments of the present disclosure will be clearly and completely described below with reference to the accompanying drawings. It is apparent that the described embodiments are some but not all of the embodiments of the present disclosure. Elements and features described in one drawing or one embodiment of the present disclosure may be combined with elements and features illustrated in one or more drawings or embodiments. Here, it should also be noted that in order to avoid obscuring the present disclosure due to unnecessary details, only a device structure and/or processing steps closely related to the solution according to the present disclosure are illustrated in the accompanying drawing, and other details having little relationship to the present disclosure are omitted. Based on the disclosed embodiments, other embodiments cover all modifications made by those skilled in the art to without departing from the spirit or scope of the disclosure.

Figure 1:
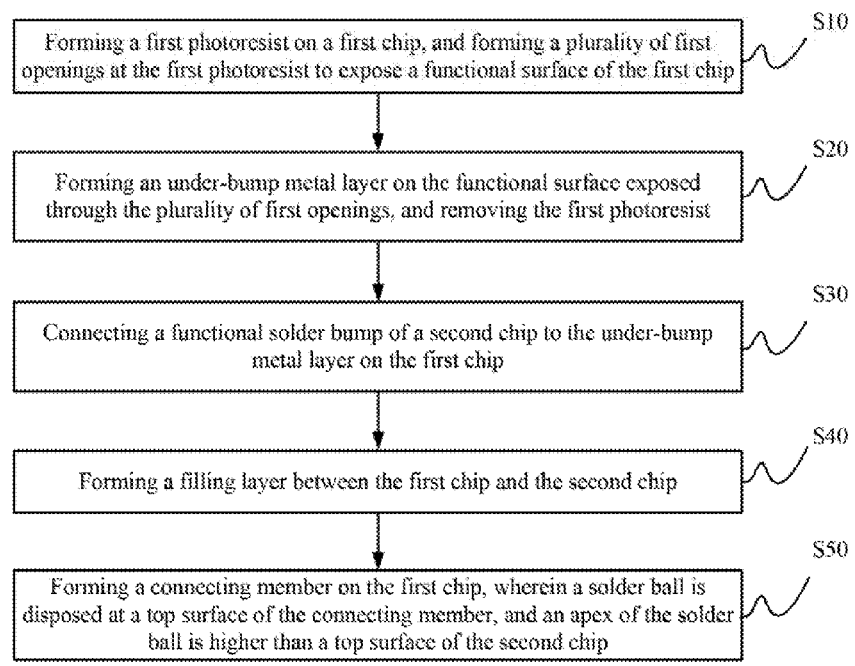
FIG. 1 illustrates a flow chart of an exemplary fabrication method for wafer-level packaging consistent with disclosed embodiments.

As shown in FIG. 1, the present disclosure provides a fabricating method for wafer-level packaging, comprising:

S10: forming a first photoresist on a first chip, and forming a plurality of first openings at the first photoresist to expose a functional surface of the first chip, S20: forming an under-bump metal layer on the functional surface exposed through the plurality of first openings, and removing the first photoresist;

S30: connecting a functional solder bump of a second chip to the under-bump metal layer on the first chip;

S40: forming a filling layer between the first chip and the second chip; and

S50: forming a connecting member on the first chip, wherein a solder ball is disposed at a top surface of the connecting member, and an apex of the solder ball is higher than a top surface of the second chip.

The disclosed fabrication method for wafer-level packaging may encapsulate an upper chip and a lower chip (i.e., the first chip and the second chip) by the filling layer, thereby simplifying the connection between the upper chip and the lower chip. Moreover, the connecting member having the solder ball may be formed on the first chip, and a height difference may be formed between the connecting member and the second chip, such that the chip structure may not be destroyed when being flipped. That is, the second chip may not be destroyed when being flipped, thereby reducing the processing risks.

During the chip packaging, when the filling layer is formed between the first chip and the second chip, while a connecting base is formed on a region on the first chip other than the filling layer on the first chip, the height of the solder ball may be determined by the thickness of the connecting base. When the connecting base is a portion of the under-bump metal layer formed on the first chip other than the portion of the under-bump metal layer of the first chip connected to the functional solder bump of the second chip, the height of the solder ball may be determined by the thickness of the under-bump metal layer formed on the first chip. In the disclosed embodiments, when the types of the connecting base vary, or the height of the solder ball varies according to the height of the connecting base, the connecting member including the solder ball may have a height difference with respect to the second chip. The packaging of the first chip and the second chip will be described by the following embodiments, in which the first chip and second chip are the same.

First Embodiment

Figure 2:
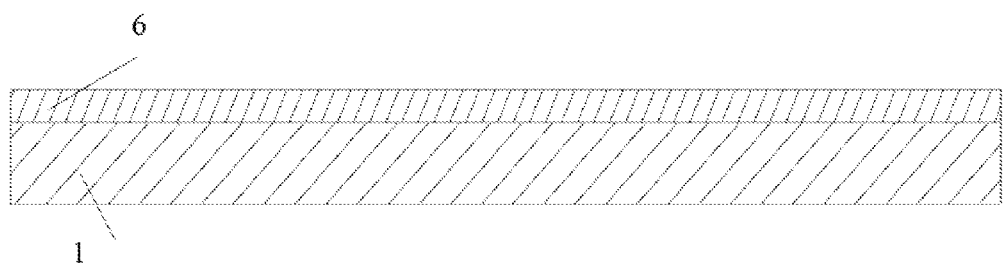
FIG. 2 illustrates a schematic diagram of coating an exemplary photoresist on a first chip consistent with disclosed embodiments.
Figure 3:
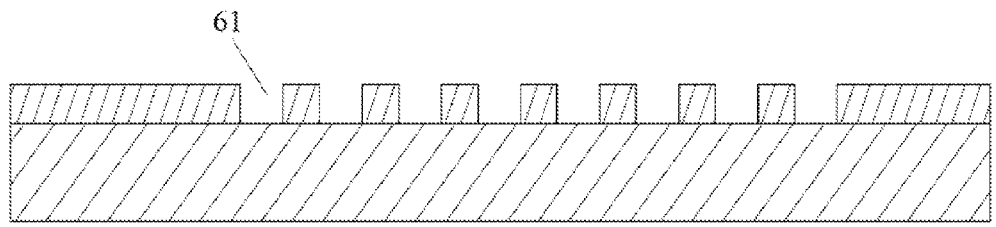
FIGS. 3-5 illustrate a schematic diagram of forming an exemplary under-bump metal layer on a first chip according to a first embodiment of the present disclosure.

First, as shown in FIG. 2, a first photoresist 6 may be formed on a first chip 1. As shown in FIG. 3, a plurality of first openings 61 may be formed on the first photoresist to expose a functional surface of the first chip.

Figure 4:
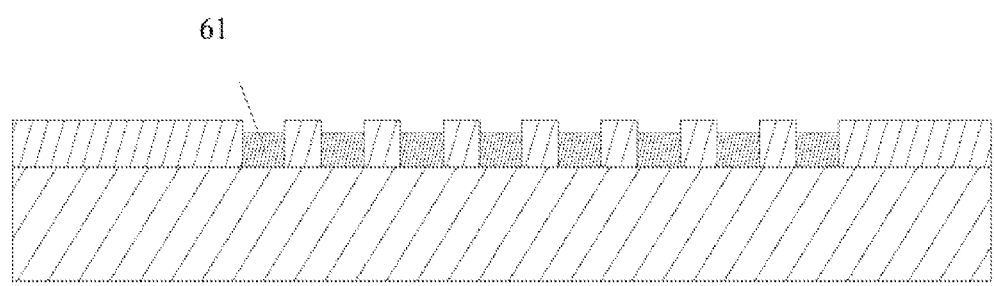
Figure 5:
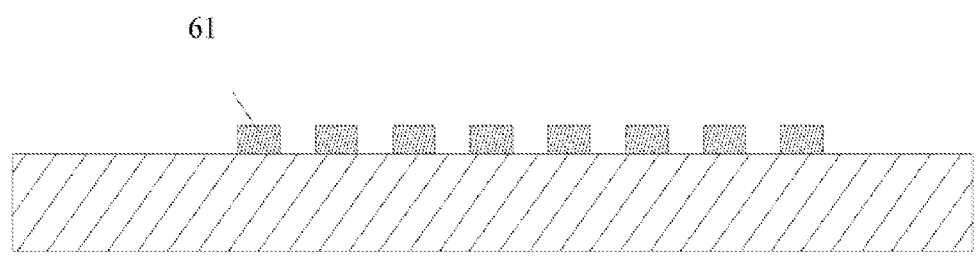

Next, as shown in FIG. 4, an under-bump metal layer 11 may be formed on the functional surface exposed by the plurality of first openings 61. Then the first photoresist may be removed, and the corresponding structure is shown in FIG. 5.

Next, a plurality of functional solder bumps of a second chip 2 may be connected to the under-bump metal layer of the first chip.

Figure 7:
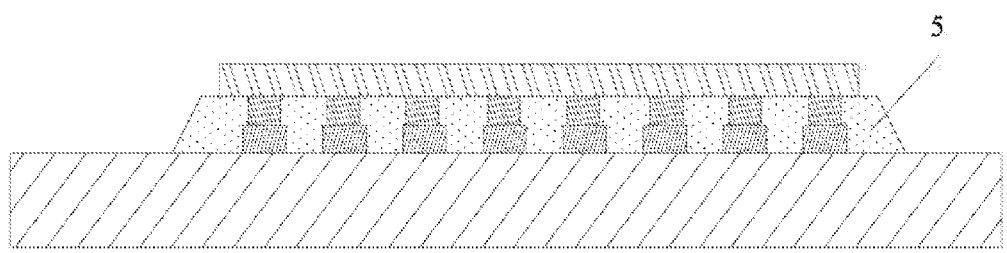
FIG. 7 illustrates a schematic diagram of forming an exemplary filling layer according to a first embodiment of the present disclosure.

Next, a filling layer 5 may be disposed between the first chip and the second chip, and the corresponding structure is shown in FIG. 7

Finally, a connecting member is formed on the first chip. A solder ball may be disposed on the top surface of the connecting member, and the apex of the solder ball is higher than the top surface of the second chip.

Figure 6:
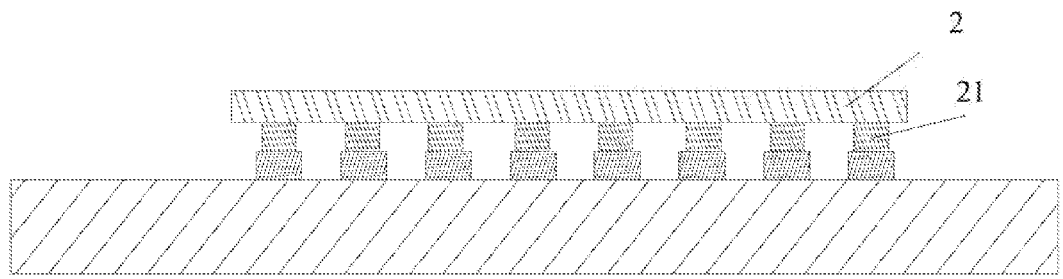
FIG. 6 illustrates a schematic diagram of an exemplary flipped chip after reflow according to a first embodiment of the present disclosure.

Further, as shown in FIG. 6, the functional solder bumps 21 of the second chip 2 may be connected to the entire under-bump metal layer formed on the first chip. As shown in FIG. 7, after the filling layer 5 is disposed between the first chip and the second chip, the connecting member may be formed on a region of the first chip other than the region disposed with the filling layer.

In one embodiment, forming the connecting member on the region of the first chip other than the region disposed with the filling layer may comprise the following steps.

Figure 8:
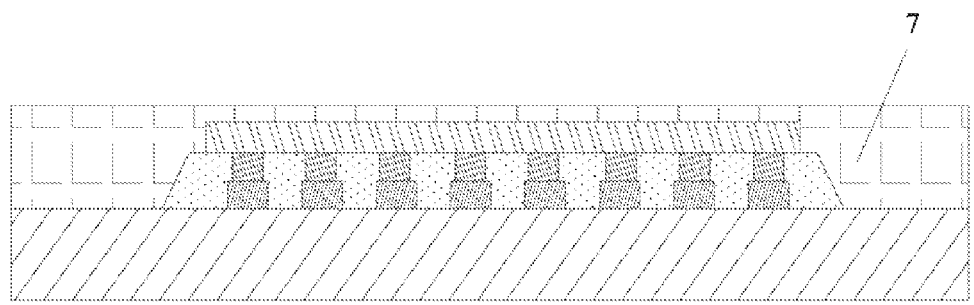
FIGS. 8-10 illustrate a schematic diagram of forming an exemplary power connecting post according to a first embodiment of the present disclosure.
Figure 9:
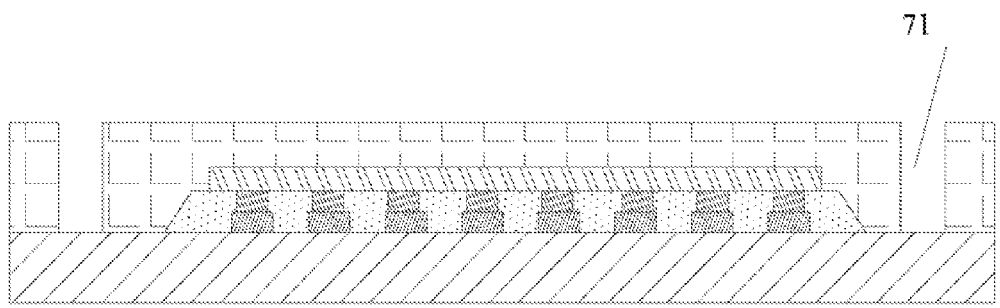

After the filling layer 5 is formed between the first chip 1 and the second chip 2, a vapor deposition layer (not shown in the drawings) may be formed on an entire structure including the first chip, the second chip, and the filling layer. Then as shown in FIG. 8, a second photoresist 7 may be formed on the vapor deposition layer. As shown in FIG. 9, a plurality of second openings 71 may be formed on the second photoresist 7 to expose a portion of the vapor deposition layer. A connecting base may be formed on the vapor deposition layer exposed through the second openings 71. Then the second photoresist may be removed to expose the remained vapor deposition layer, and a solder ball may be mounted on the top surface of the connecting base.

In another embodiment, the connecting base may be formed without the vapor deposition layer. Accordingly, after the second photoresist is removed to expose the vapor deposition layer, the removal of the vapor deposition layer may be no longer required.

Figure 10:
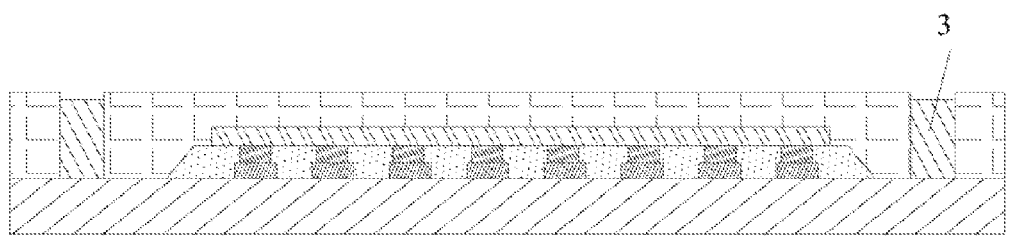
Figure 11:
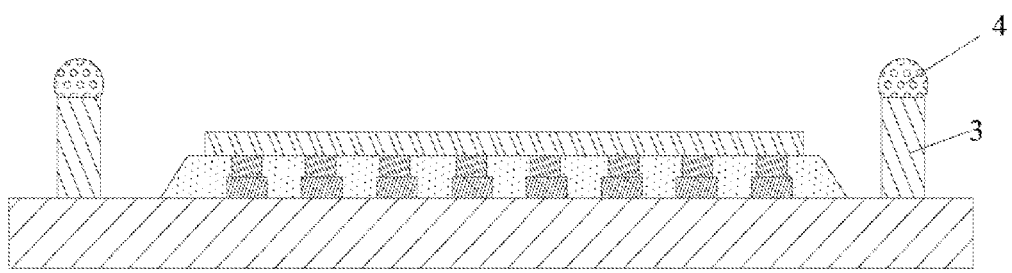
FIG. 11 illustrates a schematic diagram of an exemplary wafer-level chip according to a first embodiment of the present disclosure.

Further, in the disclosed embodiments, when the connecting base is formed on the vapor deposition layer exposed through the second openings 71, the connecting base may include a power connecting post 3. As shown in FIG. 10, the top surface of the power connecting post 3 may be higher than the top surface of the second chip. The top surface of the power connecting post 3 may be disposed with a solder ball 4, and the corresponding structure is shown in FIG. 11.

Further, the power connecting post may be a copper post, which may be formed by electroplating.

Further, provided that the upper surface of the first chip is a reference plane, the distance from the top surface of the power connecting post to the reference surface may be approximately 80 to 120 μm, and the distance from the top surface of the second chip to the reference plane may be approximately less than 60 μm. Accordingly, the top surface of the power connecting post may be higher than the top surface of the second chip.

Further, the solder ball 4 may include a tin ball. Before forming the solder ball 4, a layer of tin may be formed on the top surface of the power connecting post 3, thereby facilitating the mounting of the solder balls.

Figure 12:
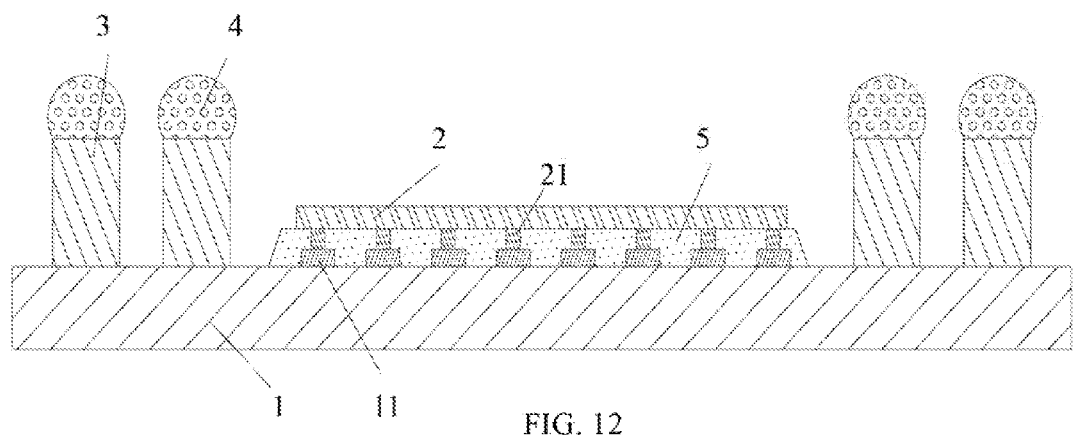
FIG. 12 illustrates a schematic diagram of another exemplary wafer-level chip according to a first embodiment of the present disclosure.

Further, a plurality of connecting members may be disposed surrounding the second chip. That is, a plurality of connecting bases may be disposed on the first chip and surrounding the second chip. In the schematic diagram of another exemplary wafer-scale chip shown in FIG. 12, a plurality of power connecting posts 3 (copper posts) may be disposed on the first chip and surrounding the second chip, and the top surface of each power connecting post 3 may be disposed with the solder ball 4.

In the disclosed embodiments, a height difference may be formed between the power connecting post disposed on the first chip and the second chip, such that the chip structure may be flipped without being destroyed. That is, the second chip may not be destroyed when being flipped, thereby reducing the processing risks.

Second Embodiment

Referring to FIGS. 2-8, the first chip and the second chip may be disposed face-to-face, and the filling layer 5 may be formed between the first chip 1 and the second chip 2. After the filling layer 5 is formed between the first chip 1 and the second chip 2, a vapor deposition layer (not shown in the drawings) may be formed on an entire structure including the first chip, the second chip, and the filling layer. Then the second photoresist 7 may be formed on the vapor deposition layer, as FIG. 8 shows. These abovementioned steps are the same as the corresponding steps disclosed by the first embodiment.

Figure 13:
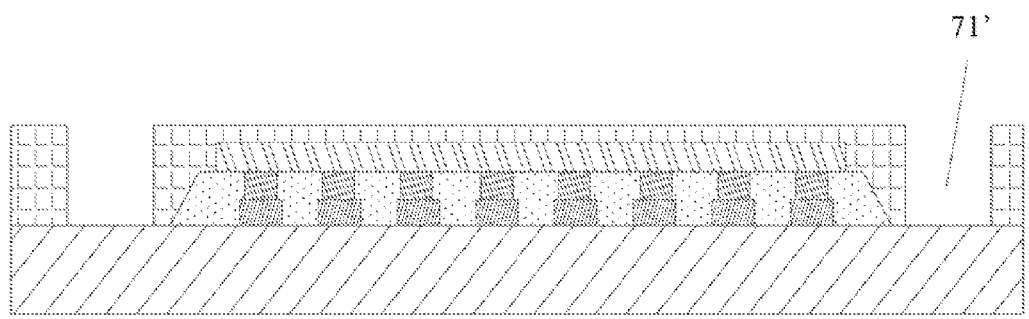
FIGS. 13-14 illustrate a schematic diagram of forming an exemplary connecting layer according to a second embodiment of the present disclosure.

As shown in FIG. 13, then a plurality of second openings 71' may be formed on the second photoresist 7 to expose the vapor deposition layer, through which a portion of the vapor deposition layer may be exposed. A connecting base may be formed on the exposed vapor deposition layer. Then the second photoresist may be removed to expose the remained vapor deposition layer, and a solder ball may be mounted on the top surface of the connecting base.

Further, the connecting base may be formed in a similar way as that disclosed by the first embodiment, i.e., the connecting base may be formed without the vapor deposition layer. Accordingly, after the second photoresist is removed to expose the vapor deposition layer, the removal of the vapor deposition layer may be no longer required. The difference between FIG. 9 and FIG. 13 is that, the width of the second opening 71' in FIG. 13 may be larger than the width of the second opening 71 in FIG. 9.

Figure 14:
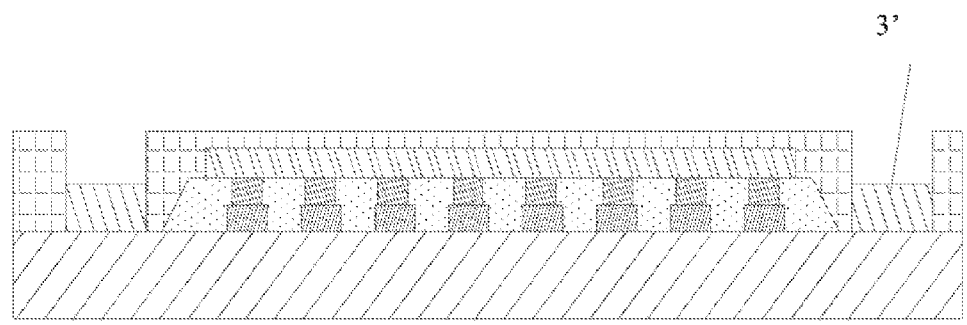
Figure 15:
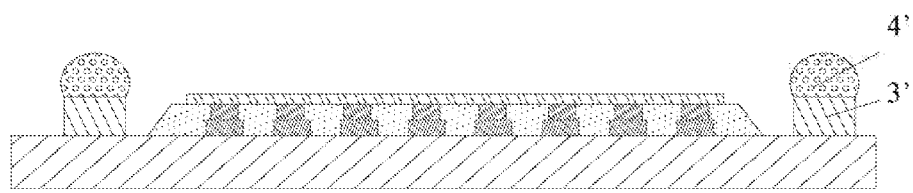
FIG. 15 illustrates a schematic diagram of an exemplary wafer-level chip according to a second embodiment of the present disclosure.

Further, in the disclosed embodiment, as shown in FIG. 14, when the connecting base is formed on the vapor deposition layer exposed through the second openings 71, the connecting base may include a connection layer 3'. A solder ball 4' may be disposed on the top surface of the connection layer 3', and the apex of the solder ball 4' may be higher than the top surface of the second chip. The corresponding structure is shown in FIG. 15.

Optionally, the connecting layer 3' may have a layered structure, which may, from top to bottom, in order include a nickel layer, a nickel-copper alloy layer, and a copper layer. As shown in FIGS. 10 and 14, the thickness of the connecting layer 3 in FIG. 14 may be significantly smaller than the height of the power connecting post 3 in FIG. 10.

Further, provided that the upper surface of the first chip is a reference plane, the distance from the apex of the solder ball to the reference surface may be approximately 100 to 150 μm, which may be further configured to be approximately 100 to 120 μm. The distance from the top surface of the second chip to the reference plane may be approximately less than 60 μm. Accordingly, the apex of the solder ball may be higher than the top surface of the second chip.

Further, the solder ball 4' may include a tin ball. Before forming the solder ball 4', a layer of tin may be formed on the top surface of the connecting layer 3', thereby facilitating the mounting of the solder balls.

Figure 16:
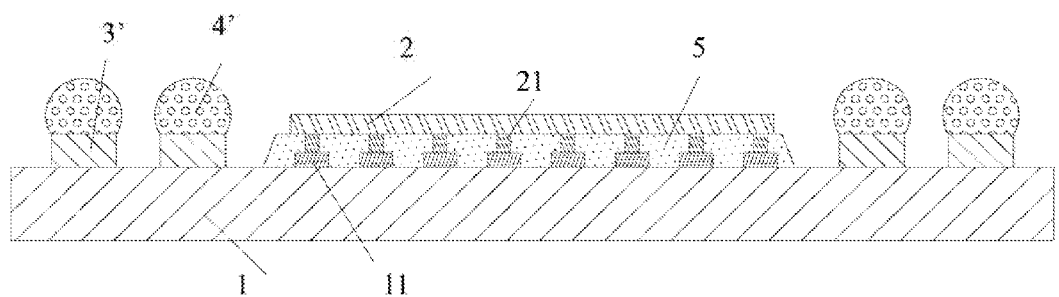
FIG. 16 illustrates a schematic diagram of another exemplary wafer-level chip according to a second embodiment of the present disclosure.

In the disclosed embodiments, a plurality of connecting members, i.e., a plurality of connecting bases, may be disposed on the first chip and surrounding the second chip. In the schematic diagram of another exemplary wafer-scale chip shown in FIG. 16, a plurality of connecting layers 3' may be formed on the first chip and surrounding the second chip, in which the top surface of each connecting layer 3' may be disposed with the solder ball 4'.

In the disclosed embodiments, the height difference may be formed between the solder ball disposed on the connecting layer and the second chip, such that the chip structure may be flipped without being destroying. That is, the second chip may not be destroyed when being flipped, thereby reducing the processing risks. In another embodiment, the thickness of the connecting layer may be increased to form the height difference between the connecting layer and the second chip, thereby realizing the flip packaging of the chips.

Third Embodiment

Figure 17:
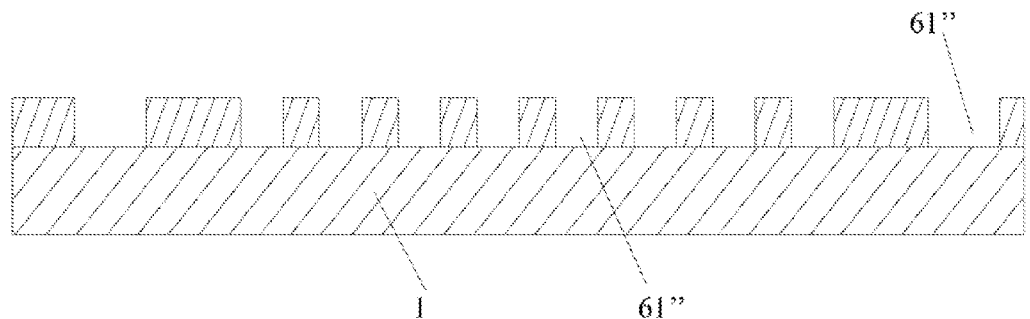
FIGS. 17-19 illustrate a schematic diagram of forming an exemplary under-bump metal layer on a first chip according to a third embodiment of the present disclosure.

First, as shown in FIG. 2, the first photoresist 6 may be formed on the first chip 1, which is similar to the above-disclosed embodiments. As shown in FIG. 17, a plurality of first openings 61' may be formed on the first photoresist 6, and the first openings 61' in FIG. 17 may be formed in a similar way as the first openings 61 in FIG. 3. However, the number of the first openings 61' in FIG. 17 may be significantly larger than the number of the first openings 61 in FIG. 3, such that when the under-bump metal layer subsequently formed on the first chip is connected to the functional solder bump of the second chip, the under-bump metal layer may be partially vacated.

Figure 18:
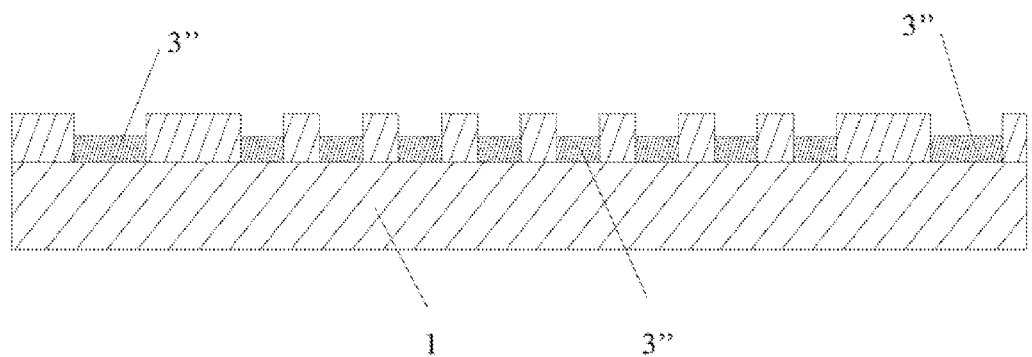
Figure 19:
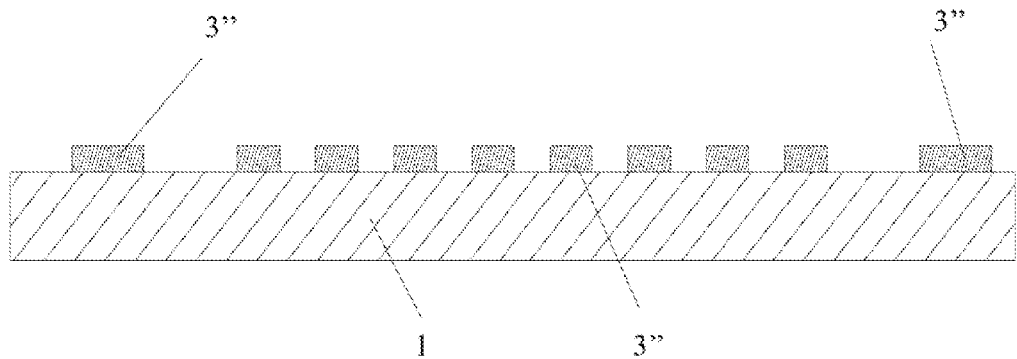

Next, as shown in FIG. 18, an under-bump metal layer 3" may be formed on the functional surface exposed by the plurality of first openings 61". Then the first photoresist may be removed, and the corresponding structure is shown in FIG. 19. The under-bump metal layer 3" may be formed on the first chip.

Figure 20:
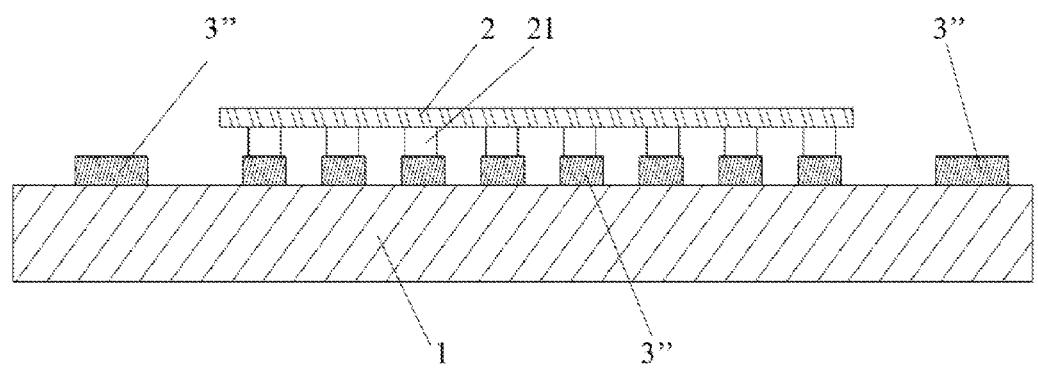
FIG. 20 illustrates a schematic diagram of an exemplary flipped chip after reflow according to a third embodiment of the present disclosure.

Next, as shown in FIG. 20, the functional solder bump of the second chip may be connected to the under-bump metal layer of the first chip. In particular, the functional solder bump of the second chip 2 may be connected to a first portion of the under-bump metal layer 3" disposed on the first chip 1.

Figure 21:
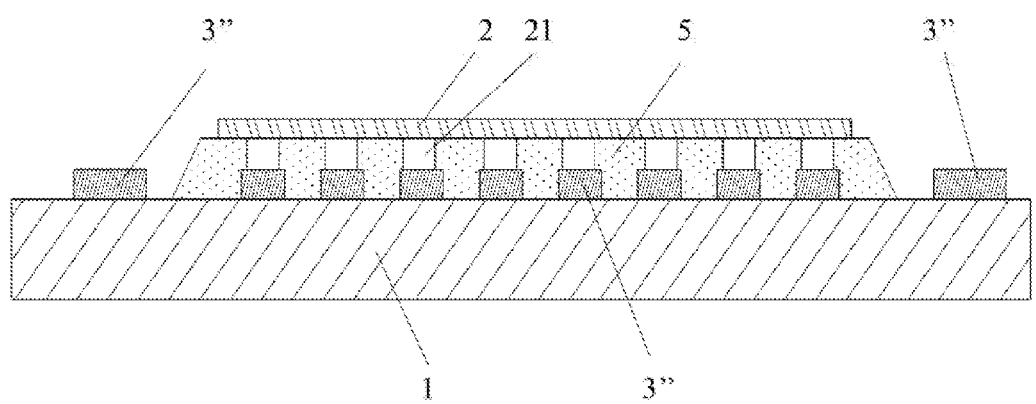
FIG. 21 illustrates a schematic diagram of forming an exemplary filling layer according to a third embodiment of the present disclosure.

Next, a filling layer 5" may be formed between the first chip and the second chip. As shown in FIG. 21, a second portion of the under-bump metal layer 3", which is disposed on the first chip 1 but outside the filling layer 5", may not be connected to the functional solder bumps of the second chip 2.

Figure 22:
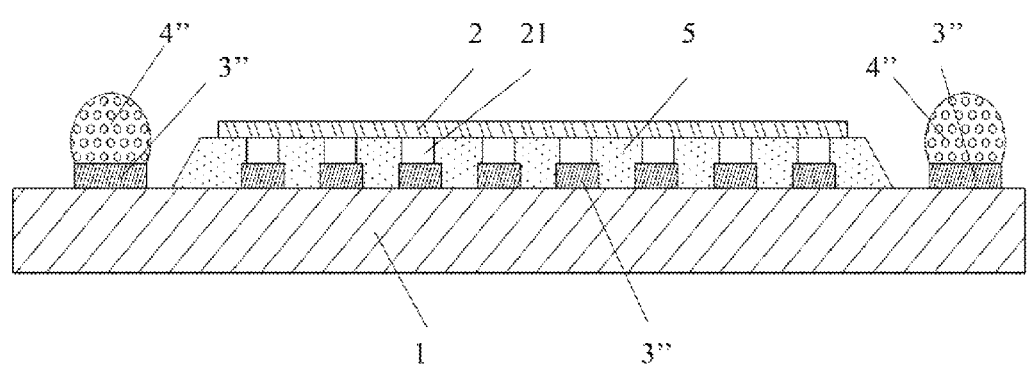
FIG. 22 illustrates a schematic diagram of an exemplary wafer-level chip according to a third embodiment of the present disclosure.

As shown in FIG. 22, a solder ball 4" may be mounted on the second portion of the under-bump metal layer 3" on the first chip, to form a connecting member.

Figure 23:
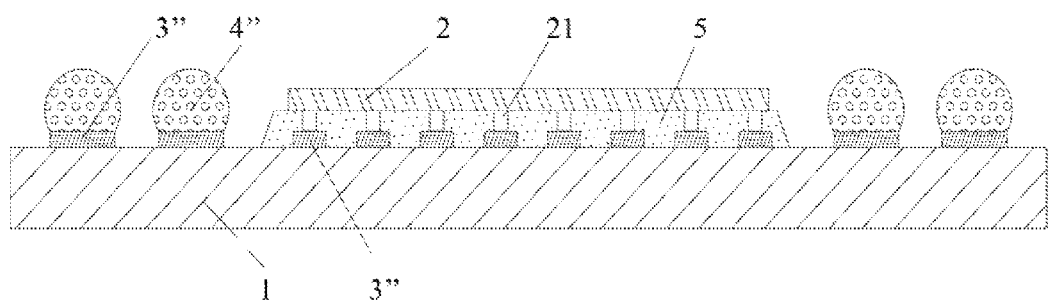
FIG. 23 illustrates a schematic diagram of another exemplary wafer-level chip according to a third embodiment of the present disclosure.

As shown in FIGS. 22-23, the first portion of the under-bump metal layer 3" disposed on the first chip 1 may be disposed on a central area of the first chip 1, while the second portion of the under-bump metal layer 3" disposed on the first chip 1 may be disposed surrounding the second chip 2. In one embodiment, as shown in FIG. 22, the solder balls 4" surrounding the second chip 2 may form one layer. In another embodiment, as shown in FIG. 22, the solder balls 4" surrounding the second chip 2 may form two layers.

Further, provided that the upper surface of the first chip is a reference plane, in one embodiment, the distance from the apex of the solder ball to the reference surface may be approximately 180 to 220 µm, and the distance from the top surface of the second chip to the reference plane may be approximately less than 150 µm.

In another embodiment, the distance from the apex of the solder ball to the reference surface may be approximately 200 µm, and the distance from the top surface of the second chip to the apex of the solder ball may be approximately 50 µm.

In the disclosed embodiments, through configuring the entire thickness of the flipped second chip to be approximately less than 150 µm and the height difference between the top surface of the second chip and the apex of the solder ball to be approximately 50 µm, the second chip may be flipped in wafer-level chip scale packaging without being destroyed, thereby reducing the processing risks. Obviously, this is an embodiment in which the top surface of the solder ball is higher than the top surface of the second chip.

In the disclosed embodiments, before forming the first photoresist on the first chip, a protective layer may be formed on the first chip, then the first photoresist layer may be formed on the upper surface of the protective layer. The first openings may expose the protective layer, which is disposed on the functional surface of the first chip. The under-bump metal layer may be formed on the upper surface of the protective layer, which is exposed through the first openings. It is to be understood that, because the under-bump metal layer is formed on the upper surface of the protective layer, the protective layer should be electrically conductive to the under-bump metal layer and the first chip. The portion of the protective layer on which the under-bump metal layer is formed may be referred as a first portion of the protective layer, while the portion of the protective layer on which the under-bump metal layer is not formed may be referred as a second portion of the protective layer. After the photoresist is removed, the second portion of the protective layer may also be removed.

The filling layer may include resin materials. The first openings and the second openings may be formed by exposure and development.

The protective layer may be formed by physical vapor deposition (PVD), in which gas or vaporized material is partially ionized by gas discharge in vacuum condition, a vapor of material or its reactant is deposited on the base when the gas irons or vaporized material are being sputtered. PVD has various advantages, such as fast deposition speed, clean surface, in particular, strong adhesion of the coated films, good diffraction, and a wide range of coating materials.

In addition, the disclosed fabrication method may be implemented into a circular wafer, through which the alignment accuracy and production efficiency may also be improved.

In the disclosed fabrication method for wafer-level packaging, the solder ball may be disposed on the connecting base formed on the first chip (e.g., power connecting post or connecting layer), or the portion of the under-bump metal layer disposed on the first chip other than the portion of the under-bump metal layer connected to the solder bump of the second chip. A certain height difference may be formed between the apex of the solder ball and the top surface of the second chip, thereby reducing the thickness of the stack-packaged chips and facilitating the subsequent flip packaging of the chips.

In the present disclosure, the number of the disclosed embodiments or the sequences of the embodiments are merely for illustrative purposes, and is not intended to represent advantages and disadvantages of the disclosed embodiments. The description of each embodiment has its emphasis, and for a part that is not described in detail in a certain embodiment, reference may be made to the relevant description of other embodiments.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A fabrication method for wafer-level packaging, comprising:
    forming a first photoresist on a first chip, and a plurality of first openings at the first photoresist to expose a functional surface of the first chip;
    forming an under-bump metal layer on the functional surface exposed through the plurality of first openings, and removing the first photoresist;
    connecting a functional solder bump of a second chip to the under-bump metal layer disposed on the first chip;
    forming a filling layer between the first chip and the second chip; and
    after forming the filling layer between the first chip and the second chip, forming a connecting member on the first chip, wherein a solder ball is disposed at a top surface of the connecting member, and an apex of the solder ball is higher than a top surface of the second chip.

2. The fabrication method for wafer-level packaging according to claim 1, wherein:
    connecting a functional solder bump of a second chip to the under-bump metal layer disposed on the first chip further includes: connecting the functional solder bumps of the second chip to all of the under-bump metal layer disposed on the first chip; and
    forming a connecting member on the first chip, wherein a solder ball is disposed at a top surface of the connecting member further includes: after forming the filling layer between the first chip and the second chip, forming the connecting member on a region of the first chip other than a region disposed with the filling layer.

3. The fabrication method for wafer-level packaging according to claim 1, wherein:
    connecting a functional solder bump of a second chip to the under-bump metal layer disposed on the first chip further includes: connecting the functional solder bump of the second chip to a first portion of the under-bump metal layer formed on the first chip; and forming a connecting member on the first chip, wherein a solder ball is disposed at a top surface of the connecting member further includes: mounting the solder ball on a second portion of the under-bump metal layer formed on the first chip to form the connecting member.

4. The fabrication method for wafer-level packaging according to claim 3, wherein:
the first portion of the under-bump metal layer formed on the first chip is provided at a central area of the first chip; and
the second portion of the under-bump metal layer formed on the first chip is provided surrounding the second chip.

5. The fabrication method for wafer-level packaging according to claim 3, wherein:
provided that an upper surface of the first chip is a reference plane, a distance from the apex of the solder ball to the reference surface is approximately 180-220 µm; and
a distance from the top surface of the second chip to the reference plane is approximately less than 150 µm.

6. The fabrication method for wafer-level packaging according to claim 5, wherein:
the distance from the apex of the solder ball to the reference surface is approximately 200 µm; and
a distance from the top surface of the second chip to the apex of the solder ball is approximately 50 µm.

7. The fabrication method for wafer-level packaging according to claim 1, further including:
before forming the first photoresist on the first chip, forming a protective layer on the first chip, and forming the first photoresist layer on an upper surface of the protective layer;
exposing the protective layer disposed on the functional surface of the first chip through the first openings;
forming the under-bump metal layer on the upper surface of the protective layer exposed through the first openings, wherein a portion of the protective layer on which the under-bump metal layer is disposed forms a first portion of the protective layer, while a portion of the protective layer on which the under-bump metal layer is not disposed forms a second portion of the protective layer;
removing the second portion of the protective layer after removing the photoresist.

8. The fabrication method for wafer-level packaging according to claim 1, wherein:
the solder ball includes a tin ball.

9. The fabrication method for wafer-level packaging according to claim 1, wherein:
the filling layer includes a resin layer.

10. The fabrication method for wafer-level packaging according to claim 4, wherein:
provided that an upper surface of the first chip is a reference plane, a distance from the apex of the solder ball to the reference surface is approximately 180-220 µm; and
a distance from the top surface of the second chip to the reference plane is approximately less than 150 µm.

11. The fabrication method for wafer-level packaging according to claim 10, wherein:
the distance from the apex of the solder ball to the reference surface is approximately 200 µm; and
a distance from the top surface of the second chip to the apex of the solder ball is approximately 50 µm.

12. A fabrication method for wafer-level packaging, comprising:
forming a first photoresist on a first chip, and a plurality of first openings at the first photoresist to expose a functional surface of the first chip;
forming an under-bump metal layer on the functional surface exposed through the plurality of first openings, and removing the first photoresist;
connecting a functional solder bump of a second chip to the under-bump metal layer disposed on the first chip;
forming a filling layer between the first chip and the second chip; and
forming a connecting member on the first chip, wherein a solder ball is disposed at a top surface of the connecting member, and an apex of the solder ball is higher than a top surface of the second chip, wherein
connecting a functional solder bump of a second chip to the under-bump metal layer disposed on the first chip further includes: connecting the functional solder bumps of the second chip to all of the under-bump metal layer disposed on the first chip;
forming a connecting member on the first chip, wherein a solder ball is disposed at a top surface of the connecting member further includes: after forming the filling layer between the first chip and the second chip, forming the connecting member on a region of the first chip other than a region disposed with the filling layer;
forming the connecting member on a region other than a region disposed with the filling layer on the first chip further includes:
after forming the filling layer the first chip and the second chip, forming a vapor deposition layer on an entire structure consisting of the first chip, the second chip, and the filling layer;
forming a second photoresist on the vapor deposition layer;
forming a plurality of second openings at the second photoresist to expose a portion of the vapor deposition layer;
forming a connecting base on the vapor deposition layer exposed through the second openings;
removing the second photoresist to expose remained vapor deposition layer;
mounting the solder ball on a top surface of the connecting base.

13. The fabrication method for wafer-level packaging according to claim 12, wherein:
the connecting base includes a power connecting post, and a top surface of the power connecting post is higher than the top surface of the second chip.

14. The fabrication method for wafer-level packaging according to claim 13, wherein:
the power connecting post includes a copper post.

15. The fabrication method for wafer-level packaging according to claim 14, wherein:
provided that an upper surface of the first chip is a reference plane, a distance from the top surface of the power connecting post to the reference surface is approximately 80 to 120 µm; and
a distance from the top surface of the second chip to the reference plane is approximately less than 60 µm.

16. The fabrication method for wafer-level packaging according to claim 13, wherein:
provided that an upper surface of the first chip is a reference plane, a distance from the top surface of the power connecting post to the reference surface is approximately 80 to 120 μm; and a distance from the top surface of the second chip to the reference plane is approximately less than 60 μm.

17. The fabrication method for wafer-level packaging according to claim 12, wherein:

the connecting base includes a connecting layer; and the connecting layer is configured to have a layered structure.

18. The fabrication method for wafer-level packaging according to claim 17, wherein:

the connecting layer includes a nickel layer, a nickel-copper alloy layer, and a copper layer disposed from top to bottom.

19. The fabrication method for wafer-level packaging according to claim 17, wherein:

provided that an upper surface of the first chip is a reference plane, a distance from the apex of the solder ball to the reference surface is approximately 100 to 150 μm; and a distance from the top surface of the second chip to the reference plane is approximately less than 60 μm.

20. The fabrication method for wafer-level packaging according to claim 12, further including:

forming a plurality of connecting members surrounding the second chip and on the first chip.

* * * * *